US 6,614,590 B2

(12) United States Patent
Tatoh

(10) Patent No.: US 6,614,590 B2
(45) Date of Patent: Sep. 2, 2003

(54) OPTICAL SEMICONDUCTOR HERMETIC SEALING PACKAGE, OPTICAL SEMICONDUCTOR MODULE AND OPTICAL FIBER AMPLIFIER

(75) Inventor: Nobuyoshi Tatoh, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/986,579

(22) Filed: Nov. 9, 2001

(65) Prior Publication Data

US 2002/0060840 A1 May 23, 2002

(30) Foreign Application Priority Data

Nov. 22, 2000 (JP) ........................................ 2000-355733

(51) Int. Cl.⁷ ............................ H01S 3/00; H01S 5/00
(52) U.S. Cl. ........................................ 359/344; 372/43
(58) Field of Search ............................ 359/344; 372/43

(56) References Cited

U.S. PATENT DOCUMENTS

| 4,930,857 | A |   | 6/1990  | Acarlar | 350/96.2 |
| 6,163,072 | A | * | 12/2000 | Tatoh   | 257/433  |
| 6,220,765 | B1 | * | 4/2001 | Tatoh   | 385/88   |
| 6,345,917 | B2 | * | 2/2002 | Tatoh   | 385/88   |

FOREIGN PATENT DOCUMENTS

| EP | 0691555 A   | 1/1996  | ............ G02B/6/42 |
| JP | 05-067844   | 3/1993  | ............ H01S/3/18 |
| JP | 5-162386    | 6/1993  | ............ B41J/2/44 |
| JP | 06-082659   | 3/1994  | ............ G02B/6/42 |
| JP | 6-140460    | 5/1994  | ............ H01L/21/60 |
| JP | 06-314747   | 11/1994 | ............ H01L/23/02 |
| JP | 09-148681   | 6/1997  | ............ H01S/3/18 |
| JP | 10-007052   | 1/1998  | ............ B62J/6/04 |
| JP | 11-74394    | 3/1999  | ............ H01L/23/02 |
| JP | 11-330564   | 11/1999 | ............ H01L/33/00 |
| JP | 2000-121886 | 4/2000  | ............ G02B/6/42 |

* cited by examiner

Primary Examiner—Thomas G. Black
Assistant Examiner—Deandra M. Hughes
(74) Attorney, Agent, or Firm—McDermott, Will & Emery

(57) ABSTRACT

An optical semiconductor hermetic sealing package for accommodating an optical semiconductor element therein, comprising: a frame made of a metal, an insulator, or a composite of metal and insulator; a first bottom plate made of a metal fixed to the frame; a second bottom plate whose Young's modulus is larger than that of the first bottom plate and which is fixed to the surface of the first bottom plate on the opposite side to the frame; and a metal block plate that is fixed to the surface of flanges projecting on both sides of the first bottom plate, on the side of the second bottom plate. The optical semiconductor hermetic sealing package is capable of alleviating warping of the bottom plate and has an even more excellent heat radiating characteristic.

13 Claims, 4 Drawing Sheets

OPTICAL SEMICONDUCTOR HERMETIC SEALING PACKAGE, OPTICAL SEMICONDUCTOR MODULE AND OPTICAL FIBER AMPLIFIER

BACKGROUND OF THE INVENTION

1. Field of the Invention

The present invention relates to an optical semiconductor hermetic sealing package for accommodating an optical semiconductor element in its interior and an optical semiconductor module and an optical fiber amplifier using this optical semiconductor hermetic sealing package.

2. Description of the Related Art

In semiconductor devices for opto-electronics that need to operate at high speed for, for example, optical communication, in particular semiconductor modules such as those of light sources for exciting optical fiber amplifiers or of optical semiconductor amplifiers, hermetic sealing packages are employed for accommodating the optical semiconductor elements, driver ICs, etc., in their interiors.

As shown in FIG. 1 and FIG. 2, in a conventional optical semiconductor hermetic sealing package, typically, a bottom plate 2 made of Fe—Ni—Co alloy or Fe—Ni alloy such as 42 alloy, or composite metallic material such as CuW is fixed to a frame made of metal such as Fe—Ni—Co alloy such as Kovar. In particular, a CuW bottom plate 2 is employed in an optical semiconductor hermetic sealing package where there is high power consumption and which is required to have heat-radiating capability.

A frame 1 comprising the side walls of the optical semiconductor hermetic sealing package is made by machining or injection molding of the above-mentioned Kovar etc., and usually comprises ceramic terminals 3 which are made of a plurality of ceramic sheets metallized at the required parts, and the lead terminals 4 made of Kovar. In some cases a construction is adopted in which part of the frame 1 is constituted of ceramic, which is an insulator, and is integrated with the ceramic terminals 3, or a construction is adopted in which the lead terminals 4 are inserted into through-holes provided in the frame 1, and fixed by sealing with glass.

In addition, a light transmitting window 5 is formed in the frame 1 to transmit light in the interior and exterior of the package. The light transmitting window 5 normally comprises a pipe of for example Kovar which is provided with a window member made of glass or the like to provide hermetic sealing. In some optical semiconductor hermetic sealing packages, any window material of glass or the like is not employed but the optical fiber is passed through the frame 1, the optical fiber being hermetically sealed to the transmitting window by solder brazing. In this case, only the window frame pipe is joined to the frame 1 of the package.

These components such as the frame 1, bottom plate 2 and lead terminals 4 are assembled into an optical semiconductor hermetic sealing package by joining by means of silver brazing or other solder brazing. In order to perform hermetic sealing with a lid, in order to prevent corrosion of the package, and in order to facilitate soldering during assembly of the semiconductor module, usually this entire optical semiconductor hermetic sealing package is subsequently subjected to gold plating. After packaging the optical semiconductor element etc within this optical semiconductor hermetic sealing package, finally, the lid (not shown) is air-tightly fixed to the upper end face of the frame 1 of the package by welding or solder brazing through a ring made of Kovar and so forth.

In the semiconductor module, an optical semiconductor element etc. is packaged in the interior of the optical semiconductor hermetic sealing package mentioned above. Specifically, as shown in FIG. 3, in the interior of the optical semiconductor hermetic sealing package, apart from an optical semiconductor element such as a laser diode (LD) element 6 and/or a photodiode (PD) element, a driver IC to drive this, a chip thermistor for temperature detection, and so forth are packaged by being mounted on a circuit board 7.

Optical semiconductor elements, in particular LD elements, are subject to inconveniences such as that, in addition to change of oscillation wavelength with temperature, their optical output falls at high temperature, with an extremely shortened life and adverse effect on their reliability. An electronic cooling device is therefore employed to control temperatures and cool the LD element and so forth. As shown in FIG. 3, the electronic cooling device has a construction in which a plurality of electronic cooling elements (Peltier elements) 8 constituted by crystals or a sintered body of a compound semiconductor BiTe are gripped between two insulating substrates 9 made of a ceramic sheet with metallized electrodes and wiring. Typically alumina or aluminum nitride is employed as the insulating substrates 9 of the electronic cooling device; in particular, aluminum nitride (AlN), which has good thermal conductivity, is employed when high heat radiating ability is required or when power consumption of the electronic cooling device is to be kept low.

The respective electronic cooling elements 8 are electrically connected by the metallized wiring on insulating substrates 9 and are provided with a pair of leads for electrical coupling between these and the semiconductor hermetic sealing package. In assembly of the optical semiconductor module, this electronic cooling device is soldered to the bottom plate 2 of the semiconductor hermetic sealing package and then a circuit board 7, on which have been pre-mounted optical semiconductor elements, such as an LD element 6 or PD element or other components, are mounted by means of solder brazing on one of the insulating substrates 9 of the electronic cooling device.

In an optical semiconductor hermetic sealing package which are constituted by parts made of different materials, as described above, after being formed into an optical semiconductor module, there was sometimes deterioration of performance of the electronic cooling elements such as BiTe elements in an environment endurance test at −40° C. to +125° C. as specified in MIL-STD. The deterioration of performance of such electronic cooling elements is caused by cracking resulting from thermal stress concentration in the electronic cooling elements such as BiTe elements, whose Young's modulus is low and which is comparatively soft, due to warping of the bottom plate of the optical semiconductor hermetic sealing package and/or the circuit board etc on which the LD element or PD element within the semiconductor module has been mounted. The warping occurs due to the differences of thermal expansion coefficient between the members constituting the module.

When such deterioration of the performance of the electronic cooling elements occurs, the problem is experienced that power consumption becomes large because of a deterioration of cooling efficiency of the electronic cooling device, resulting, in the worst case, in temperature control of the optical semiconductor module becoming impossible to achieve because of its own generation of heat. Also, warping of the bottom plate of the semiconductor hermetic sealing package tends to occur the deviation of the optical axis of the optical system that effects optical coupling between the optical semiconductor element such as the LD element or PD element and the optical fiber, even if it does not give rise to any defects of the electronic cooling device. Such optical axis deviation causes the problem of lowering of output at the optical fiber terminals of the optical semiconductor module.

To deal with such problems, for example Japanese Patent Application Laid-open No. 6-314747 discloses the countermeasure of mitigating and absorbing warping by making the flange of the bottom plate thin, by grinding. Also, in Japanese Patent Application Laid-open No. 6-82659, the same effect is obtained by, instead of making the flange of the bottom plate thin, constructing only the flange of another metal having a small modulus of longitudinal elasticity. However, in both methods, processing is difficult and it was difficult to obtain sufficient strength.

Japanese Patent Application Laid-open No. 5-67844 proposes an optical semiconductor module in which the bottom plate of the package is also used as the insulating substrate of the electronic cooling device. Specifically, this is a method in which the bottom plate of the semiconductor hermetic sealing package is constituted by ceramic such as AlN. In this way, since no further insulating substrate is needed on one side of the electronic cooling device, miniaturization, in particular reduction in layer thickness, of the semiconductor module is achieved. However, with this method, there was the problem that, in addition to the difficulty of processing the holes etc. in the bottom plate which are provided for purposes of screw-fixing, the periphery of the holes of the bottom plate became liable to cracking when screw-fixing. Further problems included the fact that even after screw-fixing of the semiconductor module and heat radiating plate, the bottom plate was liable to cracking when warping of the heat radiating plate occurred.

Accordingly, in order to solve these problems, the inventors of the present application proposed a novel optical semiconductor hermetic sealing package in Japanese Patent Application Laid-open No. 11-074394 (Japanese Patent No. 3047864). This optical semiconductor hermetic sealing package comprises a frame made of metal, insulator, or a composite of metal and insulator, a first bottom plate made of metal fixed to this frame, and a second bottom plate fixed to the surface of this first bottom plate on the opposite side to the frame and of Young's modulus larger than that of this first bottom plate. However, with this method, the flange of the first bottom plate must be subjected to bending processing in order to mount it on the heat radiating plate, and radiation of heat from the first bottom plate to the heat radiating plate can scarcely be expected.

SUMMARY OF THE INVENTION

In view of the above-mentioned prior art, an object of the present invention is to provide an optical semiconductor hermetic sealing package wherein warping of the bottom plate can be alleviated and which has an even more excellent heat radiating characteristic, as well as an optical semiconductor module and an optical fiber amplifier wherein, thanks to the use of this optical semiconductor hermetic sealing package, deterioration of the electronic cooling elements and/or optical axis deviation do not occur.

In order to achieve the above object, a hermetic sealing package for accommodating an optical semiconductor element provided by the present invention comprises: a frame made of a metal, an insulator, or a composite of metal and insulator, a first bottom plate made of a metal fixed to the frame, a second bottom plate whose Young's modulus is larger than that of the first bottom plate and which is fixed to the surface of the first bottom plate on the opposite side to the frame, and a metal block plate that is fixed to the surface of flanges projecting on both sides of the first bottom plate on the side of the second bottom plate.

In the above-mentioned optical semiconductor hermetic sealing package according to the invention, a difference in level of 0 to 0.3 mm may be provided between the surface of the block plate fixed to the flanges of the first bottom plate and the surface of the second bottom plate. Also, the block plate may have a U-like shape and a gap for welding of an optical transparent window may be formed between the block plate, which is fixed to the flanges of the first bottom plate, the first bottom plate, the second bottom plate and the frame.

Also, in the optical semiconductor hermetic sealing package according to the invention, the Young's modulus of the first bottom plate and the block plate may be $15 \times 10^3$ kg/mm$^2$ or less and the Young's modulus of the second bottom plate may be $25 \times 10^3$ kg/mm$^2$ or more. Specifically, the second bottom plate may be made of a ceramic containing at least 90% of aluminum nitride or silicon carbide and having a flexural strength of at least 25 kg/mm$^2$. Also, the first bottom plate and the block plate may be made of copper, Fe—Ni—Co alloy, or Fe—Ni alloy.

In the optical semiconductor module and the optical fiber amplifier provided by the present invention, at least one optical semiconductor element mounted on a circuit board is accommodated in the interior of the optical semiconductor hermetic sealing package according to the invention as above. The optical semiconductor module and the optical fiber amplifier may comprise an electronic cooling device comprising Peltier elements gripped by a pair of insulating substrates between the first bottom plate of the package and the circuit board. In the optical fiber amplifier, an optical fiber is hermetically introduced into the optical semiconductor module and as the optical fiber an Er$^{3+}$ doped fiber is preferably used to efficiently amplify the signal light.

DESCRIPTION OF THE PREFERRED EMBODIMENTS

Figure 4:
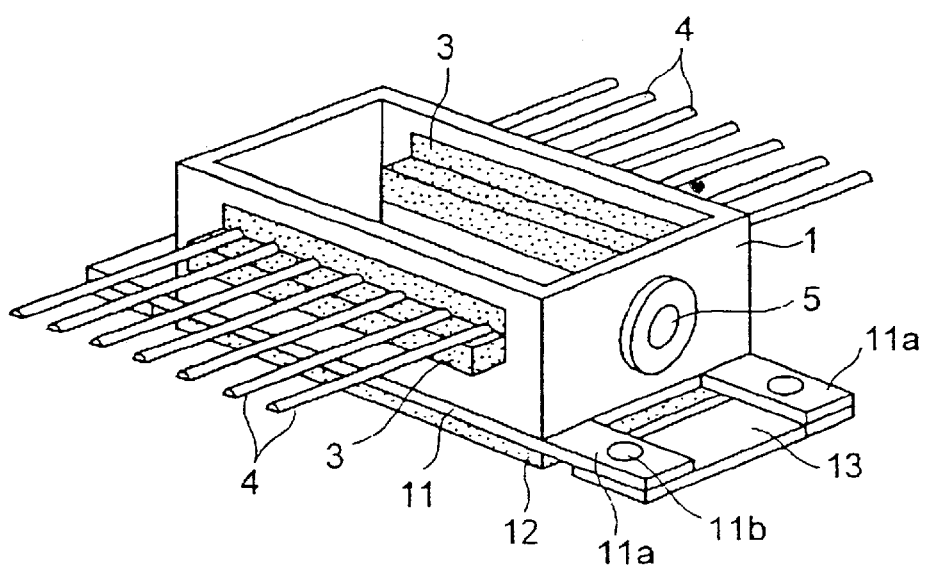
FIG. 4 is a perspective view schematically illustrating a specific example of an optical semiconductor hermetic sealing package according to the present invention.
Figure 5:
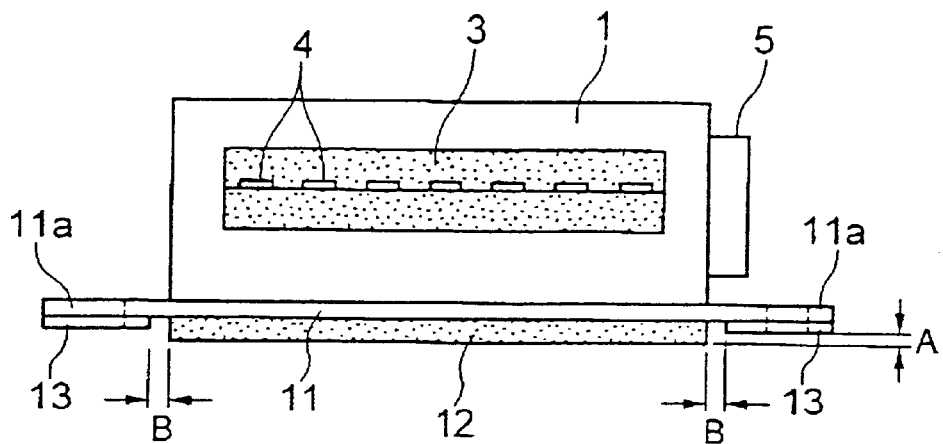
FIG. 5 is a schematic side view of the optical semiconductor hermetic sealing package illustrated in FIG. 4.
Figure 6:
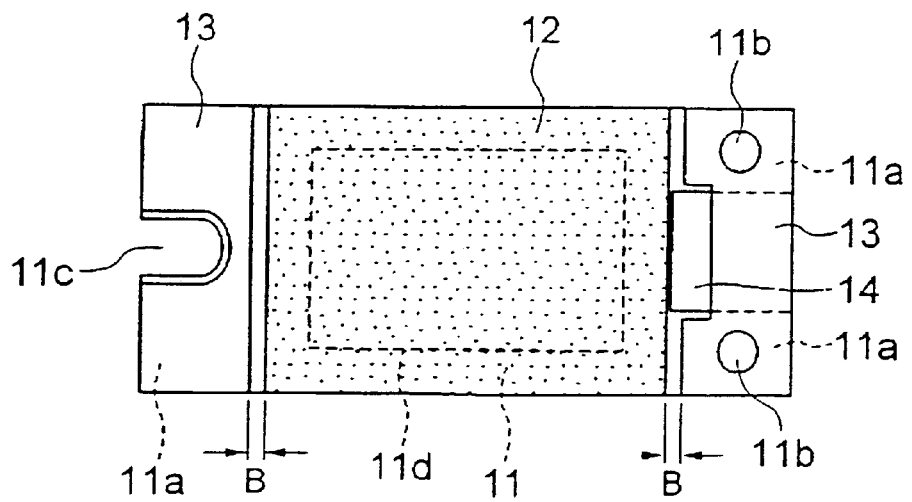
FIG. 6 is a schematic bottom face view of the optical semiconductor hermetic sealing package illustrated in FIG. 4.

As shown by a specific example in FIG. 4 to FIG. 6, in an optical semiconductor hermetic sealing package according to the present invention a bottom plate that is fixed to a frame 1 is of a double layer construction comprising a first bottom plate 11 made of metal directly fixed to the frame 1 and a second bottom plate 12 fixed to the surface of the first bottom plate 11 on the opposite side to the frame 1; a metal block plate 13 is fixed to the surface of flanges 11a, which project from both sides of the first bottom plate 11, on the side of the second bottom plate 12. The flanges 11a of the first bottom plate 11 and the block plate 13 fixed thereto are provided with screw-fixing holes 11b and/or a notch 11c processing therethrough for mounting on a heat radiating plate (not shown).

In the present invention, by fixing the metal block plate 13 to the flanges 11a of the first bottom plate 11, the contact area between the first bottom plate 11 and the radiating plate can be increased. Specifically, whereas in the case of the conventional first bottom plate, contact with the heat radiating plate was made only at a portion of the flange that was bent by the amount of the difference in level between the first bottom plate and the second bottom plate, with the present invention, contact with the heat radiating plate is effected through the block plate 13, which is of larger surface area than the flange 11a and is flat, so the heat that is transferred to the heat radiating plate from the flange 11a of the first bottom plate 11 is increased compared with conventionally, thereby enabling the overall heat radiation performance to be improved.

Also, since the difference in level between the first bottom plate 11 and the second bottom plate 12 can be reduced or eliminated by fixing the block plate 13 to the flanges 11a on the side of the second bottom plate 12, even if the first bottom plate 11 is flat plate, it can be mounted on the heat radiating plate in a simple fashion. Furthermore, since there is no need to bend the first bottom plate 11 in order to eliminate the difference in level as conventionally, generation of cracks in the second bottom plate 12, the frame 1, etc. can be prevented. In particular, as shown in FIG. 5, by making the difference A in level between the surface of block plate 13 and the surface of second bottom plate 12 be 0 to 0.3 mm, adhesion between the second bottom plate 12 and the heat radiating plate can be improved.

As shown in FIG. 5, it is preferable to provide a gap B of at least 0.1 mm between the block plate 13 that is fixed to the first bottom plate 11 and the nearest part of the second bottom plate 12. Thanks to this gap B, when mounting the first bottom plate 11 on the heat radiating plate, its flanges 11a can easily be bent by the amount of the difference A in level, enabling better adhesion to be obtained. As will be described later, in order to fix a light transmitting window 5 to the frame 1, typically laser welding is employed, but in order to carry out such laser welding without difficulty, it is necessary to provide certain gaps between the block plate 13, the first bottom plate 11 including the flanges 11a, the second bottom plate 12 and the frame 1. To this end, it is preferable either to make gap B wide enough to permit welding or to process the block plate 13 as shown in FIG. 6 so that it has a U-like shape, so as to provide a welding gap 14 between the block plate 13, the first bottom plate 11, the second bottom plate 12 and the frame 1.

In addition, in the same way as in Japanese Patent Application Laid-open No. 11-074394(Japanese Patent No.3047864), in the optical semiconductor hermetic sealing package of the present invention, stress distortion, which is the chief cause of warping of the bottom plate, is absorbed by the first bottom plate 11, which is made of metal, by making the bottom plate with a double layer construction and making the Young's modulus of the second bottom plate 12 larger than the Young's modulus of the first bottom plate 11, so no warping is generated in the second bottom plate 12, enabling its flatness to be maintained. As a result, when the optical semiconductor module is constituted, deterioration of the electronic cooling elements due to temperature changes is prevented, and optical axis deviation of the optical system also no longer occurs.

Specifically, in general, if the thermal expansion coefficient of the bottom plate is larger than the thermal expansion coefficient of the frame, tension naturally acts after brazing when assembling the semiconductor hermetic sealed package. This is because, at the high brazing temperature of about 800° C., the bottom plate elongates more than the frame, and the relative rate of contraction of the bottom plate on cooling to room temperature after the brazing material has solidified is large. This tension could be a cause of warping of the bottom plate. In the present invention, since the first bottom plate made of a thin and soft metal of low Young's modulus is interposed as the bottom plate in combination with the second bottom plate, a flat surface can be obtained like the membrane of a drum without warping of the first bottom plate after cooling. By fixing the second bottom plate of large Young's modulus to this first bottom plate, the flatness of the second bottom plate is maintained even after assembly of the package.

Thus, in order to maintain the flatness of the second bottom plate by absorbing the stress distortion in the first bottom plate, it is necessary to make the Young's modulus of the second bottom plate larger than the Young's modulus of the first bottom plate. It is therefore desirable that the Young's modulus of the first bottom plate should be $15 \times 10^3$ kg/mm$^2$ or less and the Young's modulus of the second bottom plate should be $25 \times 10^3$ kg/mm$^2$ or more in a temperature range of $-40°$ C. to $+250°$ C., taking into account the MIL-STD environmental test temperature and soldering temperature when manufacturing an LD module. Also, preferably the Young's modulus of the block plate 13 that is fixed to the flanges of the first bottom plate is $15 \times 10^3$ kg/mm$^2$, like that of the first bottom plate.

A specific example of such material for the second bottom plate is a ceramic containing at least 90% of aluminum nitride (AlN) or silicon carbide (SiC). In the case of ceramic whose Young's modulus is less than $25 \times 10^3$ kg/mm$^2$, the stress distortion cannot be sufficiently pressed to the first bottom plate, which is made of metal, so the second bottom plate itself, which is made of ceramic, ends up being warped. In particular, since AlN has a higher thermal conductivity than alumina, it is suited to a high-output type module. Also, in order not to generate cracks, damage, etc., preferably the ceramic of the second bottom plate has a flexural strength of at least $25 \times 10^3$ kg/mm$^2$. Although there is no particular restriction in regard to the thickness of the second bottom plate, usually a thickness of about 0.3 to 1.5 mm is preferable.

On the other hand, as the material of the first bottom plate and the block plate, copper, Fe—Ni—Co alloy such as Kovar, or Fe—Ni alloy such as 24 Alloy is preferable. Fe—Ni—Co alloy or Fe—Ni alloy is preferable in that its thermal expansion coefficient is close to that of the second bottom plate made of ceramic, and Cu, in particular pure copper, is preferable since, although its thermal expansion coefficient differs considerably from that of the second bottom plate, its Young's modulus is small. Metal of Young's modulus larger than $15 \times 10^3$ kg/mm$^2$ such as for example W or Mo is unsuited for the first bottom plate, since processing of thin metal sheets thereof is difficult.

The thickness of the first bottom plate is preferably 0.3 to 1.2 mm. The reason for this is that, if the thermal expansion coefficient of the frame and the first bottom plate are different, warping of the package tends to occur on brazing at a high temperature of the order of 800° C., but in order to reduce such warping it is effective to reduce the thickness of the first bottom plate to 1.2 mm or less. But if the thickness of the first bottom plate is less than 0.3 mm, this is undesirable since warping is increased. The thickness of the block plate may be determined in accordance with the thickness of the second bottom plate and the difference A in level from the second bottom plate.

The first bottom plate and the second bottom plate, and the flange of the first bottom plate and the block plate are respectively laminated and mutually joined and fixed using a brazing material etc. The first bottom plate is made of Cu or Fe—Ni—Co alloy or Fe—Ni alloy, and when a silver brazing alloy is employed as the brazing material, alloying of the first bottom plate and the silver brazing alloy may occur, resulting in distortion; however, this can be avoided by plating the first bottom plate beforehand with Ni or NiB. It is also desirable to subject the surface layer of the second bottom plate to plating with Ni or NiB in order to achieve good wetting by the brazing material. If the second bottom plate is made of ceramic or the like, a layer of one or more of W, Mo, Pt, Ti, etc. is initially formed thereon as a metallizing layer, and plating with Ni or NiB is performed on top of this metallizing layer. Preferably the thickness of the Ni or NiB plating is in the range 1.5 to 3 $\mu$m.

When the first bottom plate, the second bottom plate and the block plate are assembled, their respective shapes may be determined taking into account the need for screw-fixing etc., onto the heat radiating plate. Preferably the holes or notches for screw-fixing are provided in the block plate or flanges of the first bottom plate, as these are made of metal and easily processed. The first bottom plate and block plate which are made of metal are easily subjected to etching and/or punching and, depending on the location, may also be subjected to half-etching. Formation of a recess in the first bottom plate by half etching has the benefit of preventing positional misalignment during mounting of the frame or during mounting of the electronic cooling device and enables the yield of the packaging step to be improved.

Also, a positioning hole or recess for fitting the electronic cooling device which comprises electronic cooling elements mounted on the insulating substrates may be provided in the central part of the first bottom plate. In this way, positional location of the electronic cooling device becomes straightforward and, in addition, in particular in the case where a hole is provided for positioning, there is an advantage that heat radiating capability is improved, since the electronic cooling device is directly in contact with the heat radiating plate through the hole, even if the first bottom plate is made of a metal of low thermal conductivity, such as Kovar or 42 alloy.

Furthermore, in case where ceramic used for the second bottom plate is processed into a complex shape with high precision, difficulties are encountered. However, in case where, like the present invention, a flat ceramic plate ceramic, a ceramic plate having a recess in the region where the electronic cooling device is to be mounted, or the like is used, these ceramic plates can be manufactured simply and with low cost by an extrusion molding technique.

Figure 1:
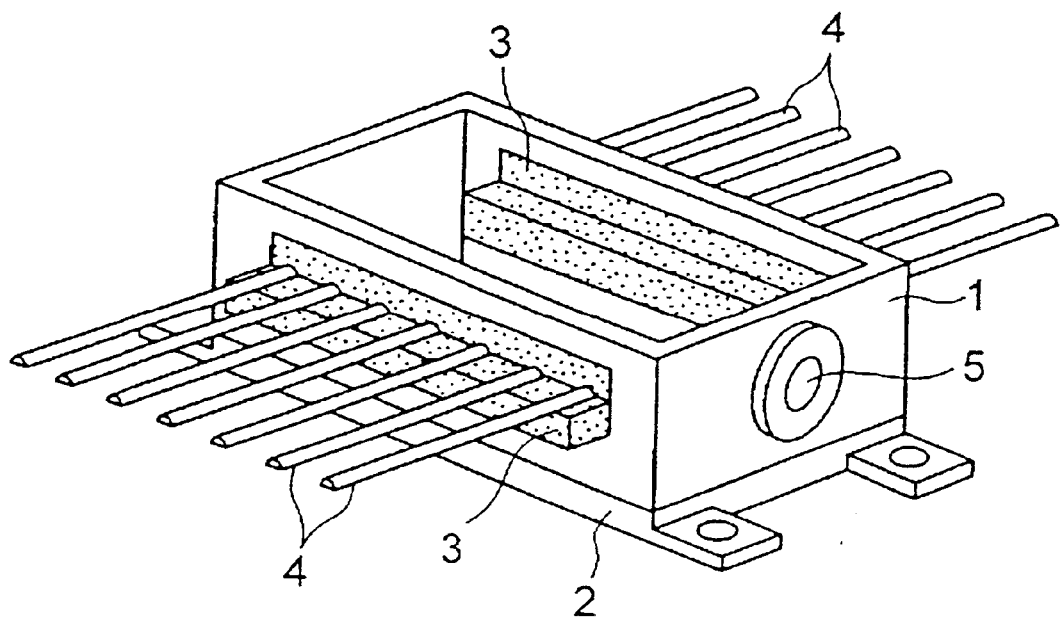
FIG. 1 is a perspective view schematically showing a prior art optical semiconductor hermetic sealing package.
Figure 2:
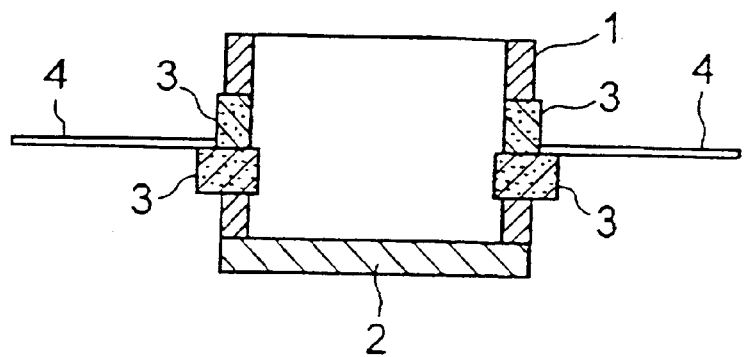
FIG. 2 is a schematic cross-sectional view of the prior art optical semiconductor hermetic sealing package.
Figure 3:
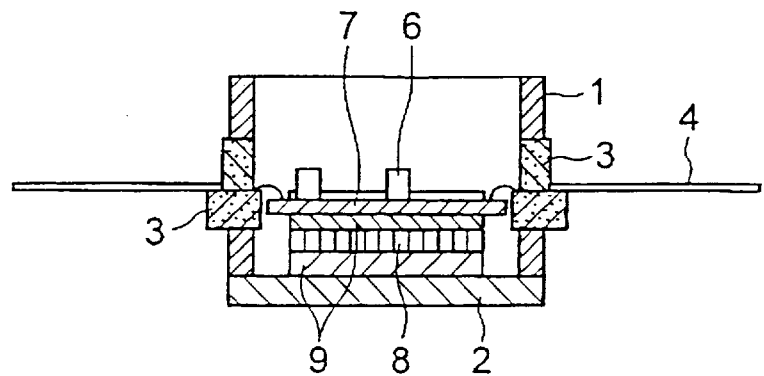
FIG. 3 is a schematic cross-sectional view of a prior art optical semiconductor module.
Figure 7:
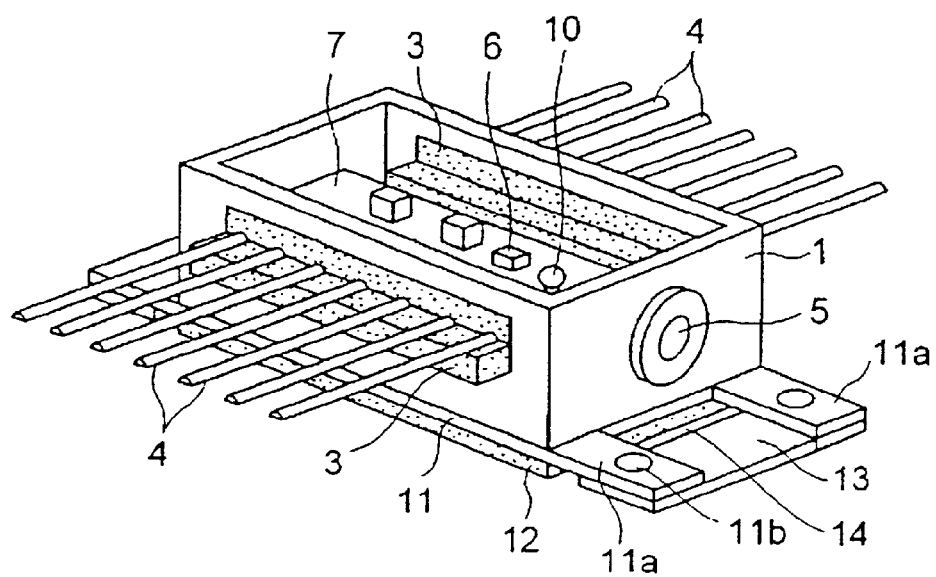
FIG. 7 is a perspective view schematically illustrating another specific example of an optical semiconductor module according to the present invention.

Onto the first bottom plate and the second bottom plate that are, as described above, laminated and fixed, the frame is fixed by brazing etc. to provide an optical semiconductor hermetic sealing package as shown for example in FIG. 4. As conventionally, metal, insulator such as ceramic, or a composite of metal and insulator may be employed for the frame. In the same way as conventionally, the electronic cooling device is mounted (see FIG. 3) in this optical semiconductor hermetic sealing package; in addition, as shown in FIG. 7, a circuit board 7, on which is mounted an optical semiconductor element 6 etc., is mounted on the electronic cooling device before hermetically sealing an opening at the top end with a lid (not shown), thereby constituting an optical semiconductor module and an optical fiber amplifier.

In constructing the optical semiconductor module and the optical fiber amplifier, preferably the differences between the thermal expansion coefficients of the circuit board for mounting the optical semiconductor element, the insulating substrate of the electronic cooling device and the second bottom plate of the semiconductor hermetic sealing package are no more than $\pm 1 \times 10^{-6}/°$ C. In this way, in the temperature change of a heat cycle of $-40°$ C. to $+125°$ C. in an MIL-STD environmental test, there is no warping above and below the electronic cooling elements, and furthermore deterioration of the electronic cooling elements incorporated in the interior thereof can be prevented, making it possible to obtain an optical semiconductor module and optical fiber amplifier free from deviation of the optical axis of the optical system.

EXAMPLES

An optical semiconductor hermetic sealing package as shown in FIG. 4 was manufactured. Specifically, for the frame 1 a Kovar plate was employed and, as the first bottom plate 11 and block plate 13, copper plates having a Young's modulus $15 \times 10^3$ kg/mm$^2$ or less within the ordinary temperature range for semiconductor module assembly ranging from $-40°$ C. to $+250°$ C. were employed. For the second bottom plate 12, an AlN ceramic plate having a Young's modulus of $25 \times 10^3$ kg/mm$^2$ or more, a flexural strength of 25 kg/mm$^2$ or more, a thermal expansion coefficient of $4.5 \times 10^{-6}/°$ C., a thermal conductivity of 150 W/m·K and an AlN content of 90% or more was employed.

The first bottom plate 11 was made of the aforementioned flat copper plate subjected to punching; as shown in FIG. 6, it was formed with flanges 11a on both sides having holes 11b and a notch 11c for screw-fixing; in addition, a positioning hole 11b for the electronic cooling device which was subsequently mounted was formed in the middle thereof. A recess was provided at the middle of the second bottom plate 12 made of AlN ceramic, corresponding to the positioning hole 11b of the first bottom plate 11. Next, Ni plating was performed on the first bottom plate 11, which was made of copper. Also, a W metallizing layer and an Ni metallizing layer (W/Ni metallizing layers), each having a thickness of no more than 500 nm, were deposited by sputtering on to the second bottom plate 12, which was made of AlN ceramic, and further Ni plating was applied on top of this. Instead of the W/Ni metallizing layers, it would be possible to employ Ti/Pt/Ni, Ti/Pd/Ni, Ti/Mo/Ni, Ti/W/Ni or the like.

The block plate 13 to be fixed to flanges 11a having screw-fixing holes 11b is processed to a U-like shape so as to enable a welding gap 14 to be formed, and is perforated matching the holes 11b for screw-fixing. There is further provided a notch in the block plate 13 fixed to the flange 11a having a notch 11c, corresponding to the location of the notch 11c. The thickness of this block plate 13 was made 0.7 mm, the thickness of the first bottom plate 11 was made 0.8 mm, and the thickness of the second bottom plate 12 was made 1.0 mm. Consequently, the difference A in level between the second bottom plate 12 and the block plate 13 was 0.3 mm. Also, the gap B of the closest portions between the block plate 13 and the second bottom plate 12 was set to 0.3 mm.

After this, the first bottom plate 11, second bottom plate 12 and the frame 1 were superimposed, and the block plates 13 mounted respectively on the flanges 11a on both sides of the first bottom plate 11 and, as shown in FIG. 4, ceramic terminals 3 comprising a plurality of ceramic sheets, a plurality of lead terminals 4 made of Kovar, a Kovar ring for seam welding, and a circular pipe made of Kovar for a light transmitting window 5 were assembled and simultaneously silver-brazed on to the frame 1. By joining these simultaneously, a lowering of costs can be achieved, and, in addition, heat radiating performance improved. After this, the optical semiconductor hermetic sealed package was completed by mounting a glass for the optical transparent window 5 and performing overall gold plating.

An optical semiconductor module as shown in FIG. 7 was manufactured using the optical semiconductor hermetic sealing package obtained. First of all, an electronic cooling device was mounted in the ordinary way on the first bottom plate 11 of the semiconductor hermetic sealing package. This electronic cooling device is an ordinary electronic cooling device in which a plurality of BiTe elements constituting Peltier elements are gripped by two insulating substrates; for the insulating substrates, AlN ceramic was employed, just as in the case of the second bottom plate 12 of the optical semiconductor hermetic sealing package.

Also, as the circuit board 7 within the optical semiconductor module for mounting purposes, a material other than AlN ceramic, for example alumina, could be employed so long as it is an insulator, but, since, if the difference in thermal expansion coefficient between this and the insulating substrates of the electronic cooling device exceeds $\pm 1 \times 10^{-6}/°$ C., deterioration of the electronic cooling elements occurs, AlN ceramic was employed just as in the case of the insulating substrates of the electronic cooling device. The difference in thermal expansion coefficient between the second bottom plate 12, the insulating substrates of the electronic cooling device, and the circuit board 7 provided for mounting purposes is therefore only of the order of $0.1 \times 10^{-6}/°$ C., which is of the order of the error of measurement of the thermal expansion coefficient.

An LD element 6 and lens 10 were fixed with their optical axes aligned on this circuit board 7 made of AlN ceramic. Furthermore, behind the LD element 6, driver ICs etc for modulation driving of the PD element and the LD element 6 were mounted on circuit board 7. The wiring on this AlN ceramic circuit board 7 is metallized in order to suppress degradation of high-frequency signals from the driver ICs, to extend the life of the driver ICs and to improve reliability. Also, a chip thermistor for temperature measurement is mounted in the vicinity of the LD element 6.

The circuit board 7 on which the LD element 6 and other elements were mounted as described above was soldered onto the insulating substrate of the electronic cooling device. The wiring leads of the electronic cooling elements were connected by hot pressure bonding to the lead terminals provided within the optical semiconductor hermetic sealing package. Other wirings were effected by ribbon-shaped wire bonds. Lastly, a gold-plated Kovar lid (not shown) was hermetically sealed to the open end of the frame 1 by seam welding.

An external optical fiber was inserted into a zirconium ceramic ferrule and ground in inclined fashion with an angle of 8 degrees. This is in order to reduce the effect of optical reflection from the end face of the optical fiber on noise of the LD element 6. An optical semiconductor module was constituted by fitting an external frame made of Fe—Ni alloy of cylindrical shape to this ferrule, inserting a lens and an isolator, to which an external frame made of Fe—Ni alloy of cylindrical shape was attached, between the optical fiber and package, effecting positional alignment of all these such that the maximum amount of light was received by the optical fiber, then assembling by welding with a YAG laser through the welding gap 14. Further, an optical fiber amplifier was manufactured by an optical coupling of an $Er^{3+}$ doped fiber and an optical coupler.

This optical fiber amplifier was fixed by screw-fixing to a heat radiating plate of 200 mm in length, 300 mm in width and 3 mm in thickness, by utilizing holes 11b and the notch 11c of the first bottom plate 11. After this, this optical fiber amplifier was subjected to a heat cycle test of $-40°$ C. to $+125°$ C. In this test, neither deterioration of the electronic cooling elements nor the drop in optical output caused due to the optical axis deviation of the optical system was observed.

It should be noted that, although in the practical example described above, AlN ceramic was employed as the second bottom plate, it would be possible to employ SiC ceramic with an SiC content of at least 90%. SiC ceramic has a high thermal conductivity of 130 W/m·K, a thermal expansion coefficient of $4.2 \times 10^{-6}/°$ C., and the difference in thermal expansion coefficient between SiC ceramic and AlN ceramic, which constitutes the insulating substrate of the electronic cooling device, is as small as $0.3 \times 10^{-6}/°$ C. Also, 42 alloy or Kovar may be employed for the first bottom plate. It is possible to dispense with the employment of an electronic cooling device in an optical semiconductor module and optical fiber amplifier, and in this case the circuit board used for mounting is directly joined to the package. Even in the case of such an arranged optical semiconductor module and optical fiber amplifier of this construction, deviation of the optical axes did not occur in the device according to the present invention. Also, with the present invention, power consumption of the optical fiber amplifier could be reduced by 20%, and high reliability achieved.

With the present invention, by eliminating warping of the base plate improving adhesion to the heat radiating plate and increasing the contact area with the base plate and the heat radiating plate, an optical semiconductor hermetic sealing package can be provided having even better heat radiating performance than conventionally. Also, by employing such an optical semiconductor hermetic sealing package, an optical semiconductor module can be provided in which drop of optical output due to optical axis deviation and deterioration of the electronic cooling elements do not occur. Also, power consumption of an optical fiber amplifier can be reduced and reliability improved.

What is claimed is:

1. An optical semiconductor hermetic sealing package for accommodating an optical semiconductor element therein, comprising: a frame made of a metal, an insulator, or a composite of metal and insulator; a first bottom plate made of a metal fixed to the frame; a second bottom plate whose Young's modulus is larger than that of the first bottom plate and which is fixed to the surface of the first bottom plate on the opposite side to the frame; and a metal block plate that is fixed to the surface of flanges projecting on both sides of the first bottom plate, on the side of the second bottom plate.

2. The optical semiconductor hermetic sealing package according to claim 1, wherein a difference in level ranging from 0 to 0.3 mm is provided between the surface of the block plate fixed to the flanges of the first bottom plate and the surface of the second bottom plate.

3. The optical semiconductor hermetic sealing package according to claim 1, wherein the block plate has a U-like shape and a gap for welding of a light transmitting window is defined between the block plate that is fixed to the flanges of the first bottom plate, the first bottom plate, the second bottom plate and the frame.

4. The optical semiconductor hermetic sealing package according to claim 1, wherein the flanges of the first bottom plate are provided with holes or a notch for screw-fixing to a heat radiating plate.

5. The optical semiconductor hermetic sealing package according to claim 1, wherein a positioning hole or recess for determining a location into which an electronic cooling device is fitted is provided in the central part of the first bottom plate.

6. The optical semiconductor hermetic sealing package according to claim 1, wherein the first bottom plate and the block plate have a Young's modulus of $15 \times 10^3$ kg/mm$^2$ or less and the second bottom plate has a Young's modulus of $25 \times 10^3$ kg/mm$^2$ or more.

7. The optical semiconductor hermetic sealing package according to claim 1, wherein the second bottom plate is made of a ceramic containing at least 90% of aluminum nitride or silicon carbide and having a flexural strength of at least 25 kg/mm$^2$.

8. The optical semiconductor hermetic sealing package according to claim 1, wherein the first bottom plate and the block plate are made of copper, Fe—Ni—Co alloy, or Fe—Ni alloy.

9. The optical semiconductor hermetic sealing package according to claim 1, wherein the thickness of the first bottom plate is 0.3 to 1.2 mm.

10. An optical semiconductor module, wherein at least one optical semiconductor element mounted on a circuit board is accommodated in the interior of the optical semiconductor hermetic sealing package according to claim 1.

11. The optical semiconductor module according to claim 10, wherein an electronic cooling device comprising Peltier elements gripped by a pair of insulating substrates is provided between the first bottom plate of the package and the circuit board.

12. An optical fiber amplifier, wherein an optical fiber is hermetically introduced into the optical semiconductor module according to claim 10.

13. The optical fiber amplifier according to claim 12, wherein the optical fiber is an Er$^{3+}$ doped fiber.

* * * * *